United States Patent
Akiyoshi

(10) Patent No.: US 7,352,648 B2
(45) Date of Patent: Apr. 1, 2008

(54) SEMICONDUCTOR MEMORY

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 47 days.

(21) Appl. No.: 11/362,152

(22) Filed: Feb. 27, 2006

(65) Prior Publication Data
US 2007/0103956 A1   May 10, 2007

(30) Foreign Application Priority Data
Nov. 8, 2005   (JP) .............................. 2005-324028

(51) Int. Cl.
*G11C 8/00* (2006.01)
(52) U.S. Cl. ..................... 365/230.03; 365/230.09; 365/221
(58) Field of Classification Search ........... 365/230.03, 365/230.09, 221
See application file for complete search history.

(56) References Cited

U.S. PATENT DOCUMENTS 5,524,264 A * 6/1996 Shirota et al. ............... 712/30
6,925,543 B2 * 8/2005 Takahashi et al. .......... 711/170
6,967,882 B1 * 11/2005 Akiyoshi ..................... 365/201

FOREIGN PATENT DOCUMENTS

JP   2005-166098 A   6/2005

* cited by examiner

*Primary Examiner*—Connie C. Yoha
(74) *Attorney, Agent, or Firm*—Arent Fox LLP

(57) ABSTRACT

At least one complete cell array having a predetermined memory capacity and an incomplete cell array having a capacity smaller than the predetermined memory capacity are arranged in one direction. The incomplete cell array is disposed closer to a signal control unit than the complete cell array. The signal control unit disposed on one-end side of a row of the cell arrays receives/outputs a signal from/to a global line. A read/write control unit disposed between the cell arrays controls data read/write from/to the cell arrays. The global line extends from one-end side of the row of the cell arrays to be connected to the read/write control unit. The global line is always wired on the short incomplete cell array, thereby reducing load capacitance and charge/discharge current thereof. This can reduce power consumption of a semiconductor memory, and shorten the access time thereof.

9 Claims, 14 Drawing Sheets

SEMICONDUCTOR MEMORY

CROSS REFERENCE TO RELATED APPLICATION

This application is based upon and claims the benefit of priority from Japanese Patent Application No. 2005-324028, filed on Nov. 8, 2005, the entire contents of which are incorporated herein by reference.

BACKGROUND OF THE INVENTION

1. Field of the Invention

The present invention relates to a semiconductor memory having a plurality of cell arrays and a global bit line for common use for the cell arrays.

2. Description of the Related Art

In a semiconductor memory such as a SRAM, a bit line connected to memory cells generally has been elongated in accordance with an increase in memory capacity. The increase in the length of the bit line increases load capacitance of the bit line, resulting in a longer access time. In order to prevent the increase in the access time due to the load capacitance of the bit line, proposed is a bit line having a hierarchical structure (for example, disclosed in Japanese Unexamined Patent Application Publication No. 2005-166098). In this art, a plurality of cell arrays having independent bit lines are formed, and a global bit line for common use for these cell arrays is arranged.

Meanwhile, in some system LSI in which a logic circuit and a memory circuit (semiconductor memory) are mounted on one chip, a memory capacity can be set according to user specification. In a system LSI of this kind, the semiconductor memory is formed as a RAM macro by using a compiler which is one of design tools of the system LSI. For example, the compiler calculates the number of word lines according to the memory capacity to allocate addresses to the respective word lines.

The compiler has, as a library, a basic cell array (complete cell array) having a predetermined memory capacity. The compiler calculates the number of the basic cell arrays to be formed on a chip according to a memory capacity needed by a user. When the memory capacity is not an integral multiple of the capacity of the basic cell array, the compiler forms an incomplete cell array smaller than the basic cell array. In typical layout design, the basic cell array is disposed on a closer side to an I/O circuit, while the incomplete cell array is disposed on the most distant side from the I/O circuit. Bit lines of the respective cell arrays and a global bit line for common use for the cell arrays are wired in a direction of the cell array arrangement.

Load capacitance of the global bit line increases as the global bit line increases in length. Therefore, when the load capacitance of the global bit line is large due to the long global bit line, charge/discharge current of the global bit line becomes large at an access time of the semiconductor memory. This results in an increase in power consumption and an increase in the access time. However, no consideration has been given heretofore to the length of the global bit line for arranging the cell arrays.

SUMMARY OF THE INVENTION

It is an object of the present invention to shorten the length of a global bit line by ingeniously arranging cell arrays, thereby reducing the power consumption of a semiconductor memory. It is another object to shorten the access time of the semiconductor memory.

According to one embodiment of the present invention, cell arrays each having memory cells, bit lines, and word lines are arranged in one direction. The cell arrays are composed of at least one complete cell array having a predetermined memory capacity and an incomplete cell array having a capacity smaller than the predetermined memory capacity. The incomplete cell array is disposed closer to a signal control unit than the complete cell array and is shorter in length in the cell array arrangement direction than the complete cell array. The signal control unit is disposed on one-end side of a row of the cell arrays, and receives/outputs a signal from/to a global line. A read/write control unit is disposed between the cell arrays to control data read/write from/to the cell arrays. The global line extends from one end of the row of the cell arrays toward the direction where the cell arrays are arranged, and is connected to the read/write control unit. The global line through which the signal is transmitted between the signal control unit and the read/write control unit is always wired on the short incomplete cell array. Therefore, the wiring length of the global line can be shortened compared with a case where the global line is wired on the complete cell array. Therefore, load capacitance of the global line can be reduced, so that it is possible to reduce charge/discharge current of the global line occurring while the cell arrays are in operation. As a result, power consumption of the semiconductor memory can be reduced, and the access time of the semiconductor memory can be shortened.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
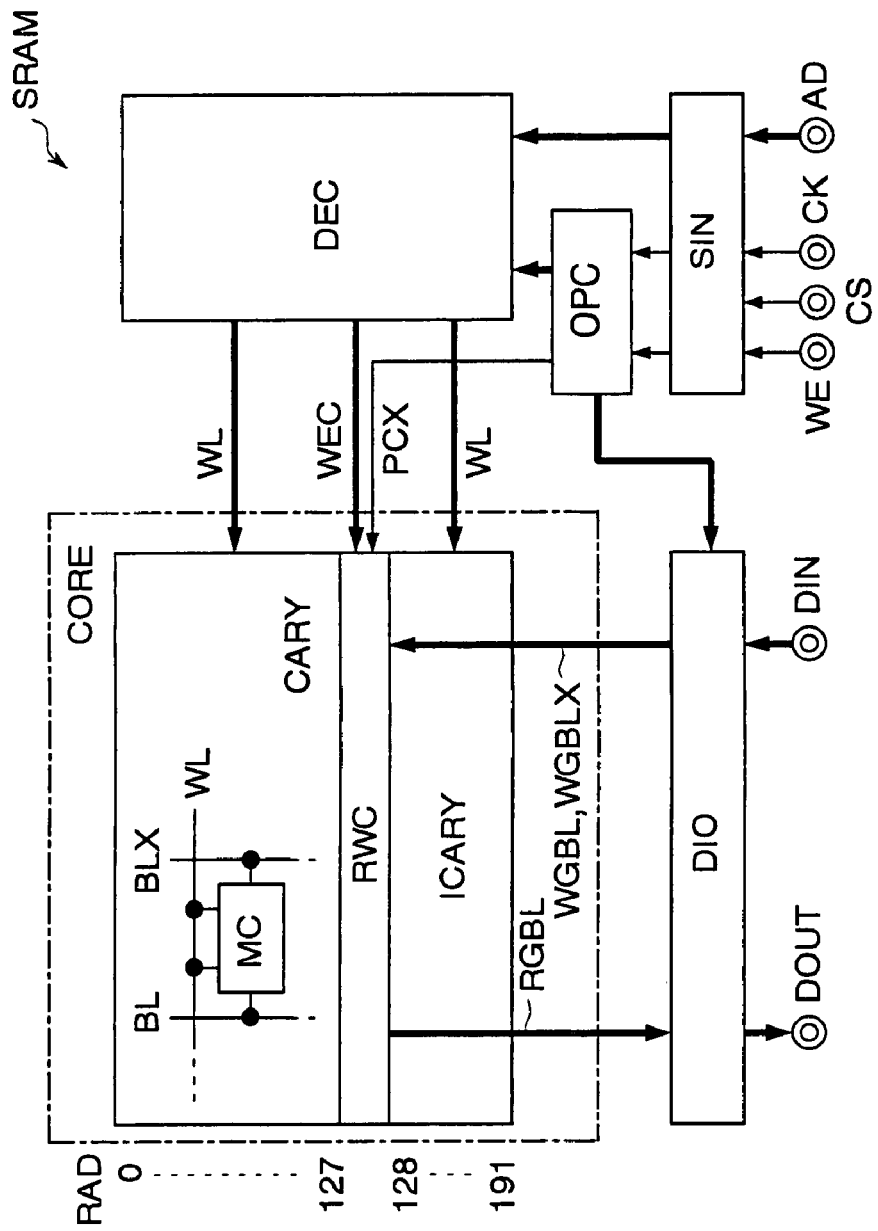
FIG. 1 is a block diagram showing a first embodiment of a semiconductor memory of the present invention.

Hereinafter, embodiments of the present invention will be described, using the drawings. Each double circle in the drawings represents an external terminal. In the drawings, each signal line shown by the heavy line is constituted of a plurality of lines. Further, part of blocks to which the heavy lines are connected is constituted of a plurality of circuits. Each signal supplied via the external terminal is denoted by the same reference symbol as the terminal name. Further, each signal line through which the signal is transmitted is denoted by the same reference symbol as the signal name. Each signal ending with "X" represents negative logic.

FIG. 1 shows a first embodiment of a semiconductor memory of the present invention. This semiconductor memory is formed as a static random access memory (hereinafter, referred to as a SRAM) on a silicon substrate by using CMOS processes. The SRAM is a RAM macro implemented in a system LSI such as a SOC (System On Chip). The RAM macro is generated by a compiler which is one of design tools of the system LSI. The SRAM has a memory core CORE, a data input/output unit DIO (signal control unit), a decoding unit DEC, an operation control unit OPC, and a signal input unit SIN.

The memory core CORE has a pair of cell arrays CARY, ICARY and a read/write control unit RWC. The cell arrays CARY, ICARY are arranged along a vertical direction in the drawing. The read/write control unit RWC is disposed between the cell arrays CARY, ICARY. The read/write control unit RWC is a circuit for common use for the cell arrays CARY, ICARY, and controls data read/write from/to the cell arrays CARY, ICARY. The read/write control unit RWC is connected to the data input/output unit DIO via a read global bit line RGBL and write global bit lines WGBL, WGBLX.

Each of the cell arrays CARY, ICARY has a plurality of static memory cells MC arranged in matrix, and word lines WL and complementary bit lines BL, BLX which are connected to the memory cells MC. Therefore, in this SRAM, a transmission path of the data read/written from/to the memory cells MC is hierarchized into the bit lines BL, BLX and the global bit lines RGBL, WGBL, WGBLX.

The cell array CARY is a complete cell array having a basic memory capacity. For example, the memory capacity of the cell array CARY is 8 k bits. The cell array ICARY is an incomplete cell array having a memory capacity smaller than the basic memory capacity. For example, the memory capacity of the cell array ICARY is 4 k bits. In this embodiment, for example, a user designing the system LSI needs a 12 k bit SRAM. The compiler configures the SRAM with the 8 k bit complete cell array CARY and the 4 k bit incomplete cell array ICARY.

The compiler disposes the cell array ICARY at a position close to the data input/output unit DIO and disposes the cell array CARY at a position distant from the data input/output unit DIO. Row addresses RAD as a basis of accessing the cell arrays CARY, ICARY are allocated in an ascending order from a position distant from the data input/output unit DIO toward the data input/output unit DIO. Thus, in this embodiment, the addresses allocated to the cell array ICARY include the largest row address RAD 191. The row addresses RAD are addresses representing the word lines WL, and are supplied from an external part of the SRAM as an address signal AD for selecting the word lines WL.

Since the addresses are allocated in the ascending order from the cell array CARY distant from the data input/output unit DIO toward the cell array ICARY, circuit design of the decoding unit DEC that decodes the address signal AD can be facilitated. In other words, by utilizing conventional programs, it is possible to easily design programs of the compiler generating the RAM macro according to user specification. Further, allocating the addresses in regular order can facilitate physical determination of a failure address when a failure occurs in the SRAM. Therefore, efficiency in failure analysis can be improved.

In the cell array CARY, 128 memory cells MC (RAD=0-127) are connected to the pair of bit lines BL, BLX. That is, the 128 memory cells MC are arranged in line in the vertical direction in the drawing. Meanwhile, in the cell array ICARY, 64 memory cells MC (RAD=128-191) are connected to the pair of bit lines BL, BLX. That is, the 64 memory cells MC are arranged in line in the vertical direction in the drawing. Therefore, the length of the cell array ICARY in a bit line direction is substantially half the length of the cell array CARY in the bit line direction.

In the cell arrays CARY, ICARY, 64 memory cells MC are connected to one word line WL. That is, the 64 memory cells MC are arranged in line in a horizontal direction in the drawing. For example, a data output terminal DOUT and a data input terminal DIN each have 64 bits. Therefore, in a read operation, 64-bit read data that are read to the data input/output unit DIO in response to the selection of the word line WL are simultaneously outputted to the data output terminal DOUT. Similarly, in a write operation, 64-bit write data are simultaneously written to the 64 memory cells MC selected by the row address RAD.

The data input/output unit DIO is arranged on an external terminal DOUT, DIN side of a row of the cell arrays CARY, ICARY. In the read operation, the data input/output unit DIO receives via the read global bit line RGBL the data read from the memory cells MC and outputs the received data to the data output terminal DOUT. In the write operation, the data input/output unit DIO converts the write data supplied to the data input terminal DIN into complementary data and outputs the converted data to the memory core CORE via the write global bit lines WGBL, WGBLX. In this embodiment, the external data terminal DOUT for reading and the external data terminal DIN for writing are independently formed, but an external data terminal commonly used for reading and writing may be formed.

In the read operation, the read/write control unit RWC amplifies the data read to the bit line BL and outputs the amplified data to the read global bit line RGBL. In the write operation, the read/write control unit RWC outputs to the bit lines BL, BLX the complementary write data supplied to the write global bit lines WGBL, WGBLX.

In this embodiment, the global bit lines RGBL, WGBL, WGBLX are routed on the cell array ICARY. The length of the global bit lines RGBL, WGBL, WGBLX can be shortened compared with a case where they are routed on the cell array CARY. This can reduce load capacitance of the global bit lines RGBL, WGBL, WGBLX. Therefore, it is possible to reduce charge/discharge current at the time of the read operation and the write operation. Moreover, it is possible to shorten the time for the read data and the write data to be transmitted to/from the data input/output unit DIO from/to the read/write control unit RWC. As a result, power consumption while the SRAM is in operation can be reduced and the access time (read operation time and write operation time) can be shortened. In particular, in a semiconductor memory, a large number of the global bit lines RGBL, WGBL, WGBLX are routed on the cell arrays CARY, ICARY (192 lines in this example). Therefore, the effect of reducing the power consumption is significant.

In the read operation and the write operation, the decoding unit DEC decodes the address signal AD (=the row address RAD) in synchronization with a timing signal from the operation control unit OPC and activates the word line WL corresponding to the address signal AD to high level. In the write operation, the decoding unit DEC decodes the address signal AD (=the row address RAD) in synchronization with the timing signal from the operation control unit OPC and activates a write control signal WEC (WEC0-1 shown in FIG. 2) corresponding to the address signal AD to high level. In response to the activation of the write control signal WEC, the write global bit lines WGBL, WGBLX are connected to the bit lines BL, BLX of one of the cell arrays CARY, ICARY.

The operation control unit OPC detects a read request and a write request according to a write enable signal WE and a chip select signal CS supplied via the signal input unit SIN to generate the timing signal for controlling the read operation and the write operation of the SRAM according to the detected request. The generated timing signal is outputted to the decoding unit DEC, the data input/output unit DIO, and so on. For example, in the read operation and the write operation, the operation control unit OPC outputs a word line activation timing signal for setting an activation period of the word line WL. In a standby period during which neither the read operation nor the write operation is executed, the operation control unit OPC activates a precharge signal PCX to low level in order for the read global bit line RGBL to be precharged to high level.

In synchronization with a clock signal CLK, the signal input unit SIN receives the write enable signal WE, the chip select signal CS, and the address signal AD supplied to external terminals to output the received signals to the operation control unit OPC and the decoding unit DEC. While the chip select signal CS is active, the signal input unit SIN detects the read request when the write enable signal WE is at low level and detects the write request when the write enable signal WE is at high level.

Figure 2:
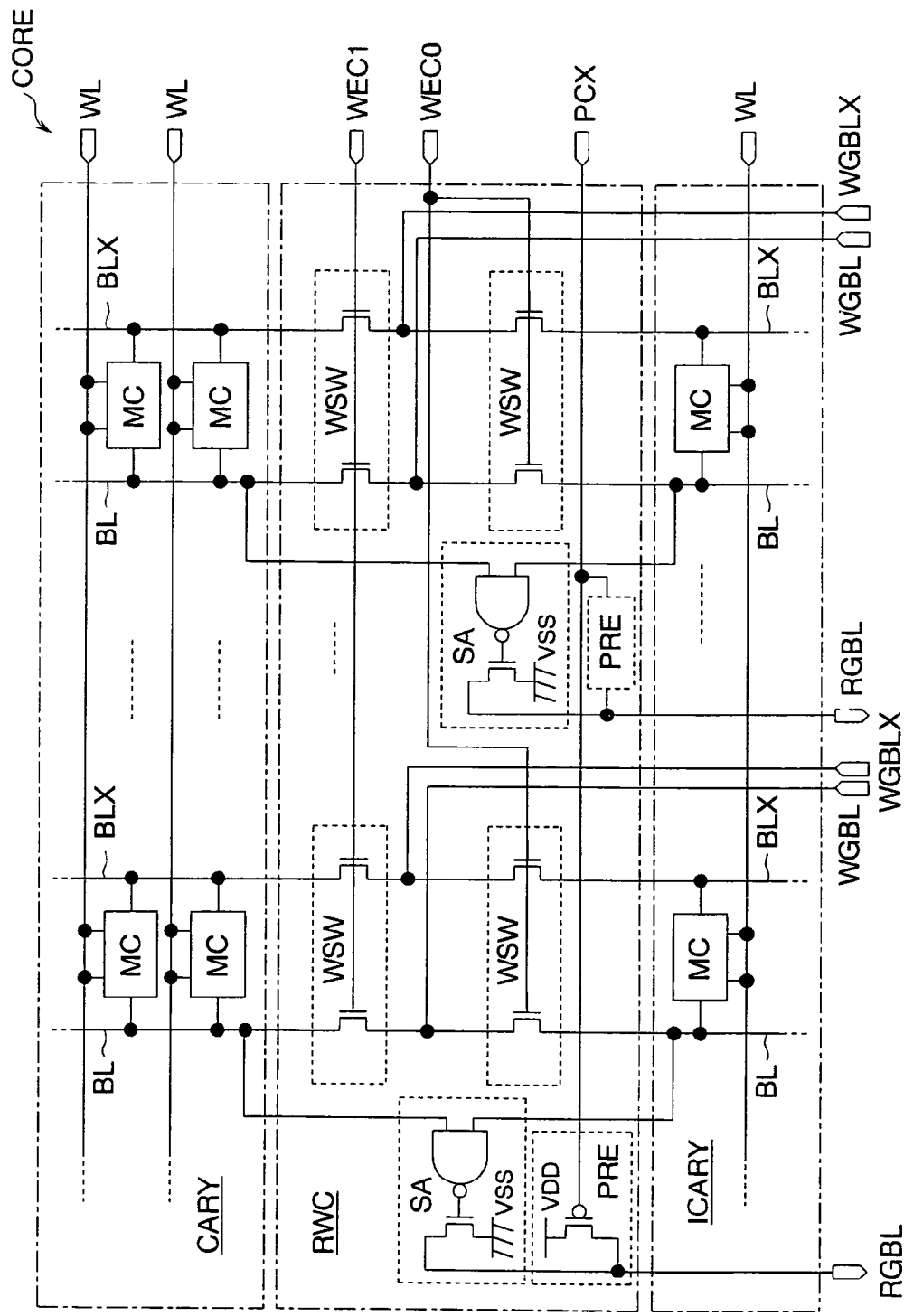
FIG. 2 is a circuit diagram showing details of a memory core shown in FIG. 1.

FIG. 2 shows details of the memory core CORE shown in FIG. 1. The cell arrays CARY, ICARY have the plural static memory cells MC arranged in matrix and connected to the complementary bit lines BL, BLX and the word lines WL, as described above.

The read/write control unit RWC has sense amplifiers SA, precharge circuits PRE, and write switches WSW. Each of the sense amplifiers SA has: a two-input NAND gate (negative logic OR-circuit) whose inputs are connected to the bit lines BL of the cell arrays CARY, ICARY; and an nMOS transistor whose gate is connected to an output of the NAND gate. The nMOS transistor has a source connected to a ground line VSS and a drain connected to the read global bit line RGBL. Thus, the sense amplifier SA is shared by the cell arrays CARY, ICARY. The sense amplifier SA amplifies a signal volume of the data read to the bit line BL to decide the logic of the data. Specifically, in the read operation, when low level (logic 0) is read to the bit line BL from the memory cell MC, the NAND gate outputs high level. The nMOS transistor of the sense amplifier SA turns on and the read global bit line RGBL changes from high level to low level. In the read operation, when high level (logic 1) is read to the bit line BL from the memory cell MC, the nMOS transistor turns off. Therefore, the read global bit line RGBL is kept at high level.

Each of the precharge circuits PRE has a pMOS transistor receiving the precharge signal PCX at its gate. The pMOS transistor has a source connected to a power supply line VDD and a drain connected to the read global bit line RGBL. In the standby period during which neither the read operation nor the write operation is executed, the precharge circuit PRE turns on upon receiving the low-level precharge signal PCX in order to precharge the read global bit line RGBL to high level (VDD).

Each of the write switches WSW has an nMOS transistor connecting the write global bit line WGBL to the bit line BL and an nMOS transistor connecting the write global bit line WGBLX to the bit line BLX. When the cell array CARY executes the write operation, the write switch WSW connected to the bit lines BL, BLX of the cell array CARY turns on according to the write control signal WEC1. Similarly, when the cell array ICARY executes the write operation, the write switch WSW connected to the bit lines BL, BLX of the cell array ICARY turns on according to the write control signal WEC0.

Figure 3:
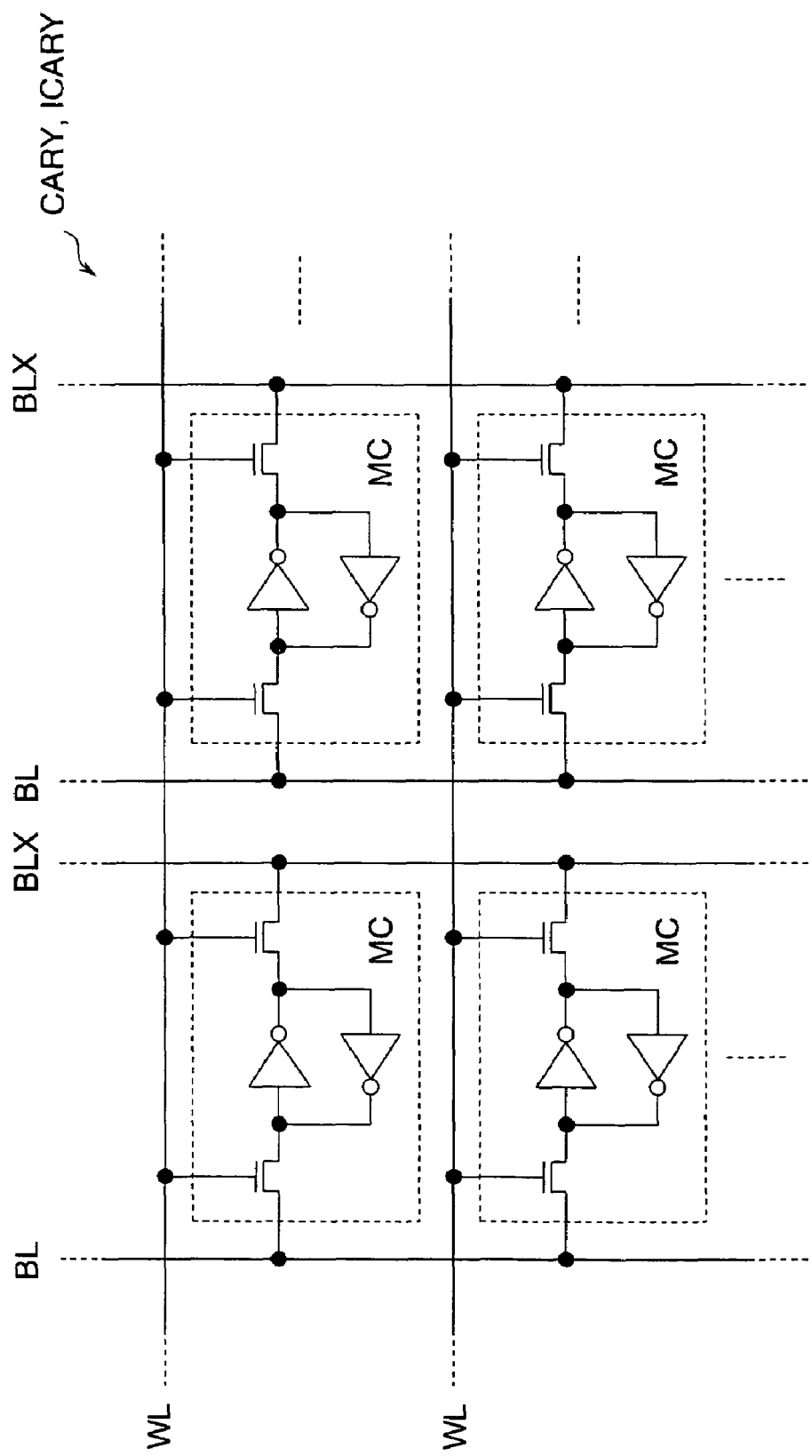
FIG. 3 is a circuit diagram showing details of memory cells shown in FIG. 2.

FIG. 3. shows details of the memory cells MC shown in FIG. 2. Each of the memory cells MC has a latch having a pair of inverters and holding the write data and a pair of transfer transistors (nMOS transistors) whose one-side ends are connected to complementary storage nodes of the latch (output nodes of the inverters) respectively. The other end of each of the transfer transistors is connected to one of the complementary bit lines BL, BLX. Gates of the transfer transistors are connected to the word line WL.

Figure 4:
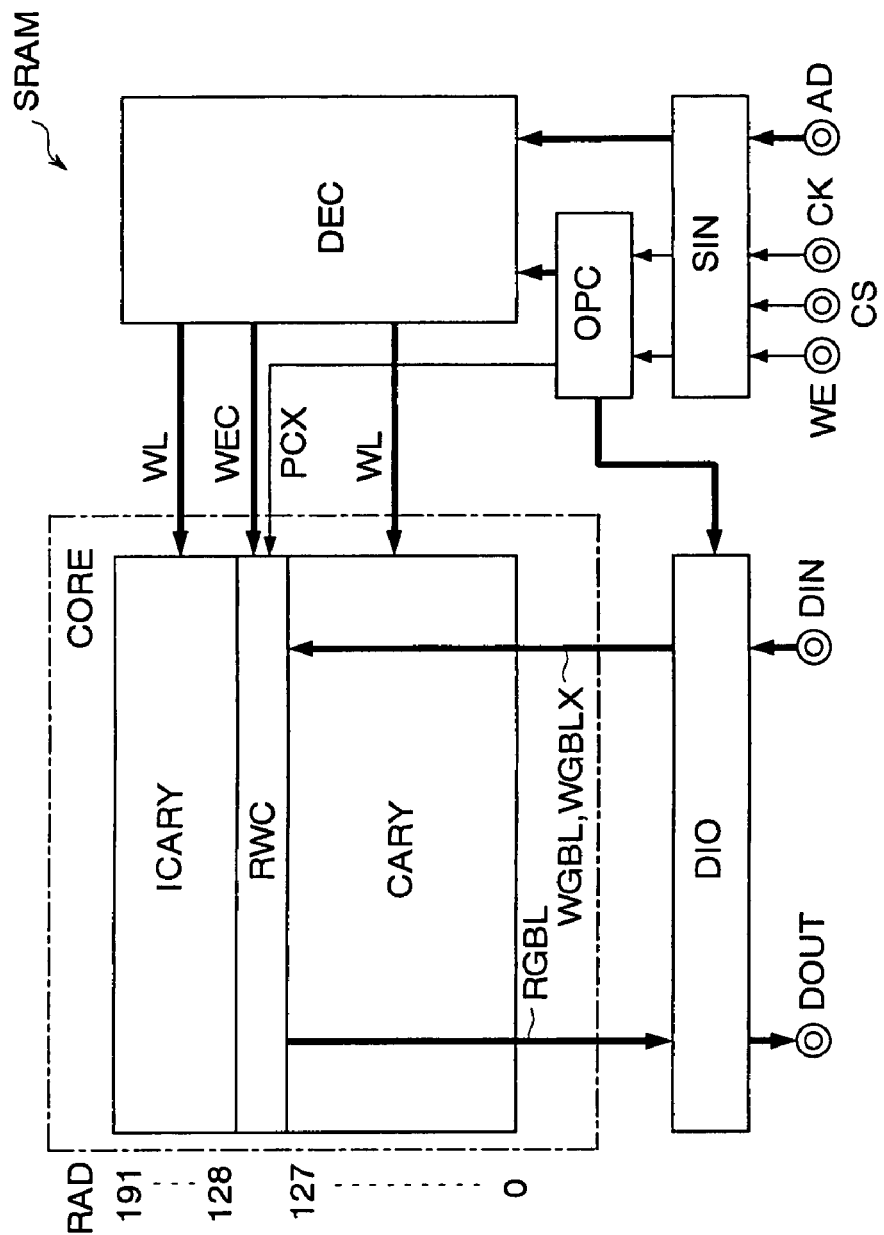
FIG. 4 is a block diagram showing a comparative example of the first embodiment.

FIG. 4 shows a comparative example of the first embodiment. In this example, an incomplete cell array ICARY is disposed at a position distant from a data input/output unit DIO. Global bit lines RGBL, WGBL, WGBLX are routed on a complete cell array CARY close to the data input/output unit DIO. Since a SRAM shown in FIG. 4 has the global bit lines RGBL, WGBL, WGBLX which are longer than those in FIG. 3, load capacitance thereof is large. Therefore, power consumption of the SRAM increases and the access time also becomes longer.

In the first embodiment described above, since the incomplete cell array ICARY is disposed closer to the data input/output unit DIO than the complete cell array CARY, the wiring length of the global bit lines RGBL, WGBL, WGBLX can be shortened. Consequently, the load capacitance of the global bit lines RGBL, WGBL, WGBLX can be reduced, and it is possible to reduce charge/discharge current of the global bit lines occurring while the cell arrays ICARY, CARY are in operation. As a result, the power consumption of the SRAM can be reduced and the access time of the SRAM can be shortened. Applying the present invention to a RAM macro whose memory capacity is settable according to user specification makes it possible to minimize power consumption of a chip implemented with the RAM macro, for each user.

Figure 5:
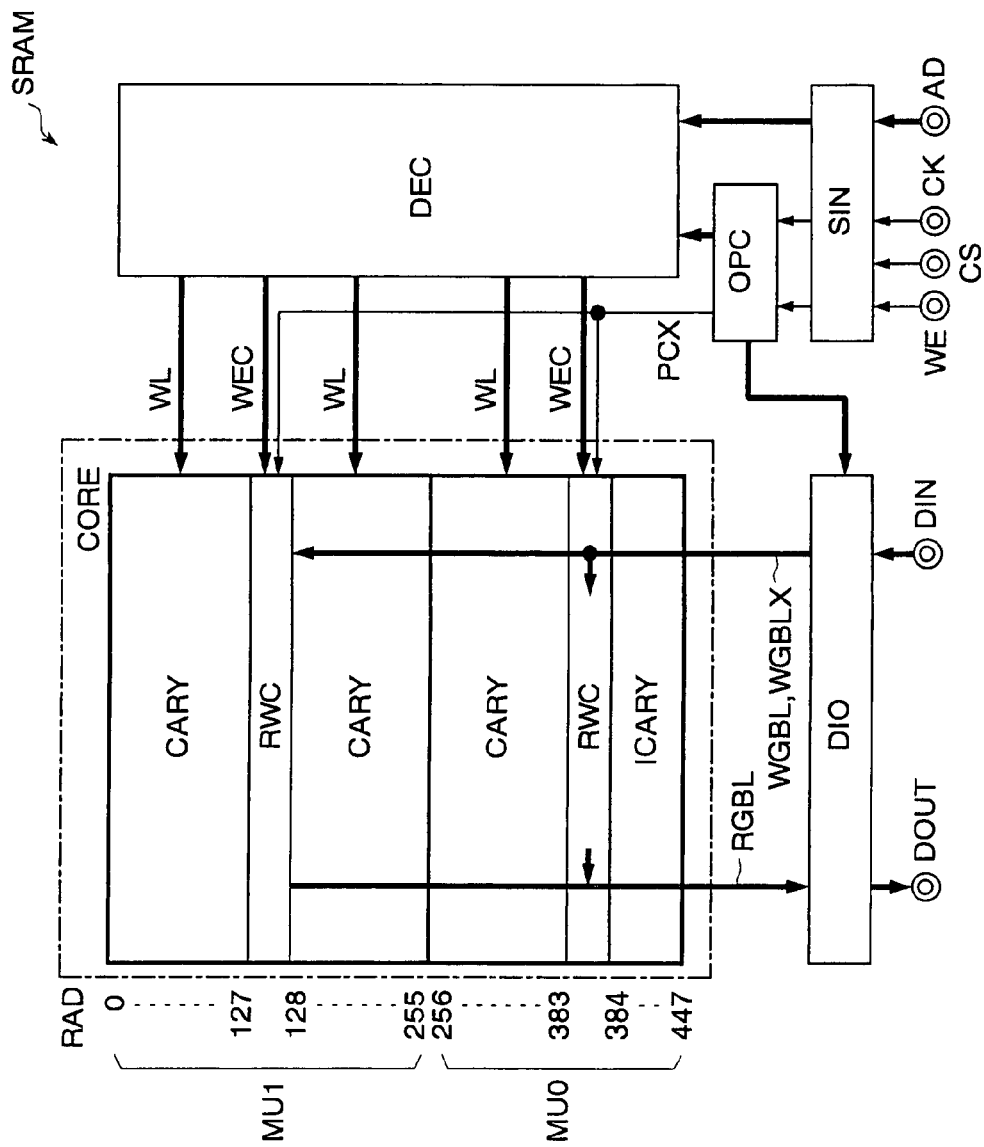
FIG. 5 is a block diagram showing a second embodiment of a semiconductor memory of the present invention.

FIG. 5 shows a second embodiment of a semiconductor memory of the present invention. The same reference symbols are used to designate the same elements as the elements described in the first embodiment, and detailed description thereof will be omitted. A SRAM of this embodiment is different from that of the first embodiment in a memory capacity and a structure of a memory core CORE. Accordingly, the number of bits of an address signal AD becomes larger, and accordingly a decoding unit DEC and so on are different from those of the first embodiment. However, basic functions of the respective circuit blocks are the same as those in the first embodiment.

The memory core CORE has a pair of memory units MU0, MU1. The memory unit MU0 has a complete cell array CARY, an incomplete cell array ICARY, and a read/write control unit RWC disposed between the cell arrays CARY, ICARY. In the memory unit MU0, the incomplete cell array ICARY is disposed closer to the data input/output unit DIO than the complete cell array CARY. That is, the incomplete cell array ICARY is disposed on a data input/output unit DIO side of the read/write control unit RWC.

The memory unit MU1 has a pair of complete cell arrays CARY and a read/write control unit RWC disposed between the complete cell arrays CARY. The memory unit MU0 is disposed at a position closer to the data input/output unit DIO than the memory unit MU1.

In this embodiment, for example, a user designing a system LSI needs a 28 k bit SRAM. The memory core CORE is constituted of the three complete cell arrays (8 k bits each) and the single incomplete cell array ICARY (4 k bits). Row addresses RAD are allocated in an ascending order from a position most distant from the data input/output unit DIO toward the data input/output unit DIO. The addresses allocated to the cell array ICARY include the largest row address RAD 447. As in the first embodiment, the addresses are allocated in the ascending order from the cell array CARY distant from the data input/output unit DIO toward the cell array ICARY, which can facilitate circuit design of the decoding unit DEC decoding the address signal AD. In other words, by utilizing conventional programs, it is possible to easily design programs of a compiler generating a RAM macro, according to user specification. Moreover, allocating the addresses in regular order facilitates physical determination of a failure address, enabling enhanced efficiency in failure analysis when a failure occurs in the semiconductor memory.

A read global bit line RGBL and write global bit lines WGBL, WGBLX are connected to the read/write control units RWC of the memory units MU0-1. A circuit configuration of the read/write control units RWC is the same as the above-described configuration in FIG. 2. The global bit lines RGBL, WGBL, WGBLX are routed on the two complete cell arrays CARY and on the incomplete cell array ICARY. By routing the global bit lines RGBL, WGBL, WGBLX on the incomplete cell array ICARY, the wiring length of the global bit lines RGBL, WGBL, WGBLX becomes short as in the first embodiment. Therefore, power consumption of the SRAM can be reduced and the access time can be shortened.

Figure 6:
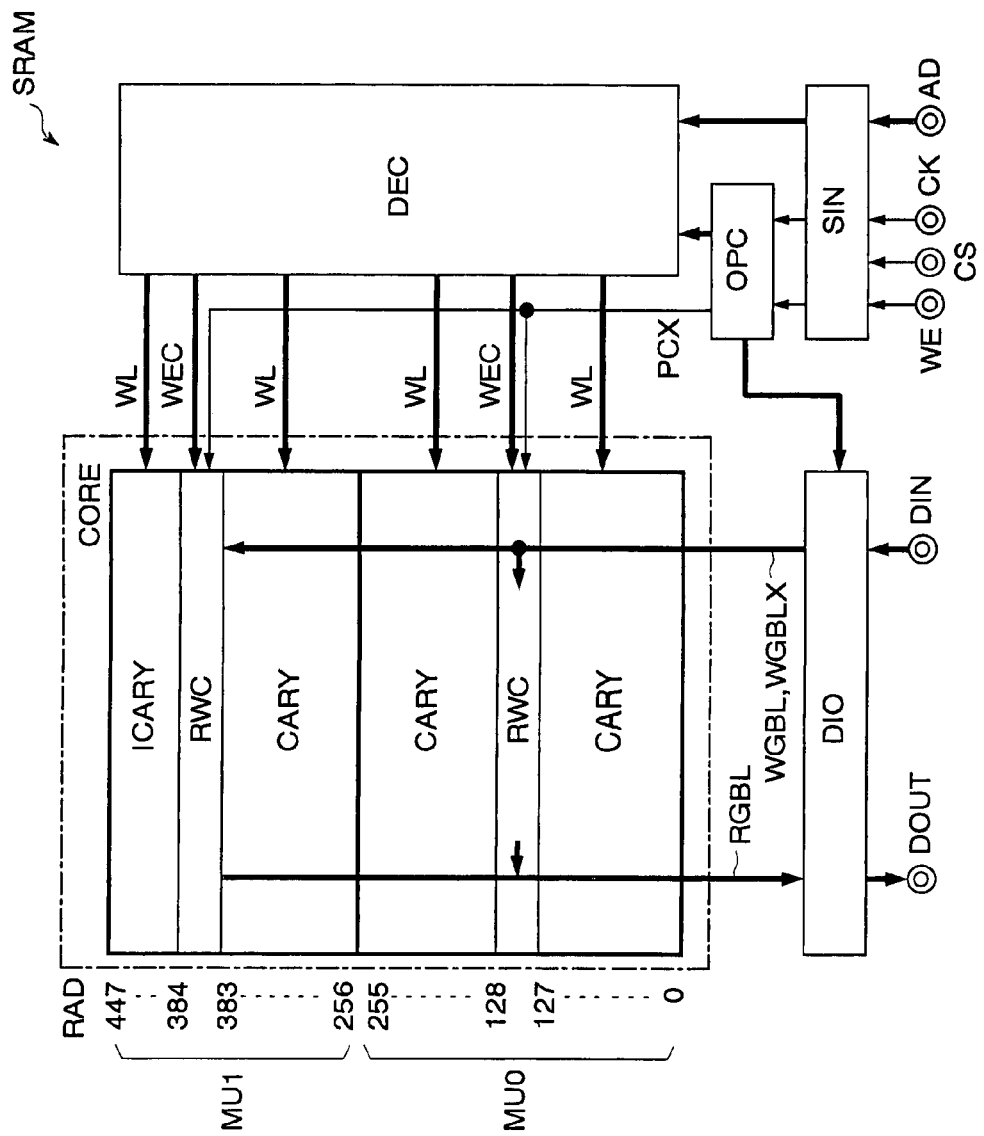
FIG. 6 is a block diagram showing a comparative example of the second embodiment.

FIG. 6 shows a comparative example of the second embodiment. Similarly to the above-described configuration in FIG. 4, in this example, an incomplete cell array ICARY is disposed at a position distant from a data input/output unit DIO. Therefore, global bit lines RGBL, WGBL, WGBLX are routed on three complete cell arrays CARY and are not routed on the incomplete cell array ICARY. Since load capacitance of the global bit lines RGBL, WGBL, WGBLX becomes larger, power consumption of a SRAM increases and the access time also becomes longer.

The second embodiment described above can also provide the same effects as those of the above-described first embodiment. In addition, also in the SRAM having the plural complete cell arrays CARY and the single incomplete cell array ICARY, it is possible to reduce charge/discharge current of the global bit lines RGBL, WGBL, WGBLX to reduce power consumption of the SRAM. Further, the access time of the SRAM can be shortened.

Figure 7:
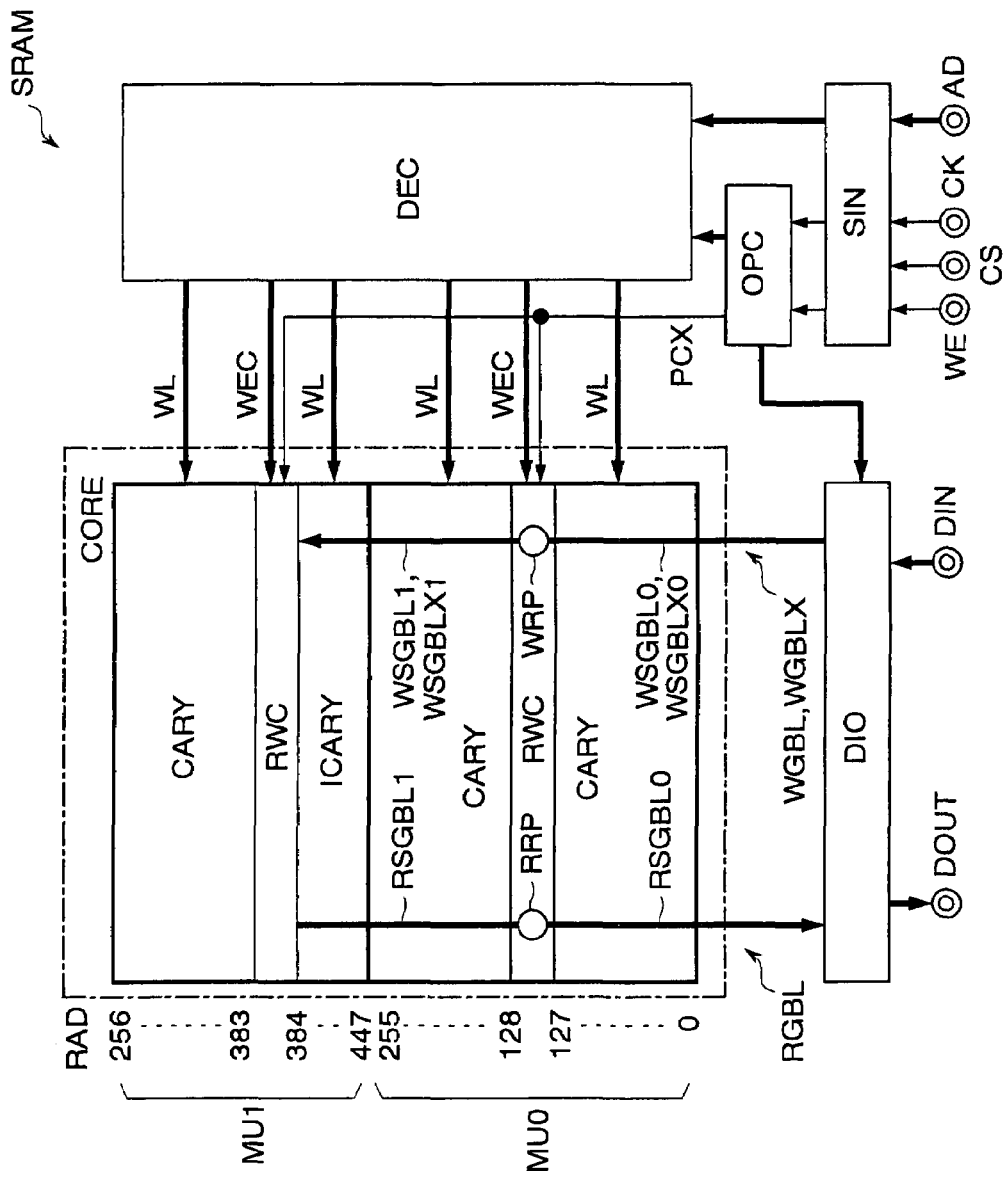
FIG. 7 is a block diagram showing a third embodiment of a semiconductor memory of the present invention.

FIG. 7 shows a third embodiment of a semiconductor memory of the present invention. The same reference symbols are used to designate the same elements as the elements described in the first and second embodiments, and detailed description thereof will be omitted. A SRAM of this embodiment is different from that of the second embodiment in a structure of a memory core CORE. Specifically, the position of an incomplete cell array ICARY and the structures of a read global bit line RGBL and write global bit lines WGBL, WGBLX are different from those of the second embodiment. Repeater circuits RRP, WRP are formed in a read/write control circuit RWC. The other configuration is the same as that of the second embodiment (FIG. 5).

A pair of read sub global bit lines RSGBL0-1, when connected to each other by the repeater circuit RRP, form the read global bit line RGBL. A pair of write sub global bit lines WSGBL0-1 and a pair of write sub global bit lines WSGBLX0-1, when connected to each other by the repeater circuit WRP, form the write global bit lines WGBL, WGBLX.

Forming the repeater circuits RRP, WRP makes it possible to disconnect the sub global bit lines RSGBL1, WSGBL1, WSGBLX1 corresponding to a memory unit MU1 from the global bit lines RGBL, WGBL, WGBLX when a memory unit MU0 closer to a data input/output unit DIO is accessed. That is, the sub global bit lines RSGBL1, WSGBL1, WSGBLX1 are disconnected from the data input/output unit DIO and are not charged/discharged. This reduces load capacitance of the global bit lines RGBL, WGBL, WGBLX, so that power consumption at the access time can be reduced. Besides, the access time can be shortened.

In this embodiment, the memory units MU0-1 have 256 word lines and 192 word lines respectively. Therefore, when the SRAM is randomly accessed, an access ratio of the memory units MU0-1 is "4:3". Meanwhile, when the memory unit MU0 is accessed, only the sub global bit lines RSGBL0, WSGBL0, WSGLBX0 are used. When the memory unit MU1 is accessed, both the sub global bit lines RSGBL0-1, WSGBL0-1, WSGBLX0-1 are used. When the memory unit MU1 is accessed, charge/discharge current of the global bit lines RGBL, WGBL, WGBLX increases and thus power consumption at this time is larger than power consumption when the memory unit MU0 is accessed.

In the SRAM in which the repeater circuits RRP, WRP are inserted, the incomplete cell array ICARY is disposed at a position except a position most distant from the data input/output unit DIO, and the memory unit MU0 (a memory unit not including the cell array ICARY) whose access frequency is high is disposed close to the data input/output unit DIO, which makes it possible to minimize the charge/discharge current of the global bit lines RGBL, WGBL, WGBLX. As a result, power consumption (average value) at the access time of the SRAM can be reduced.

Figure 8:
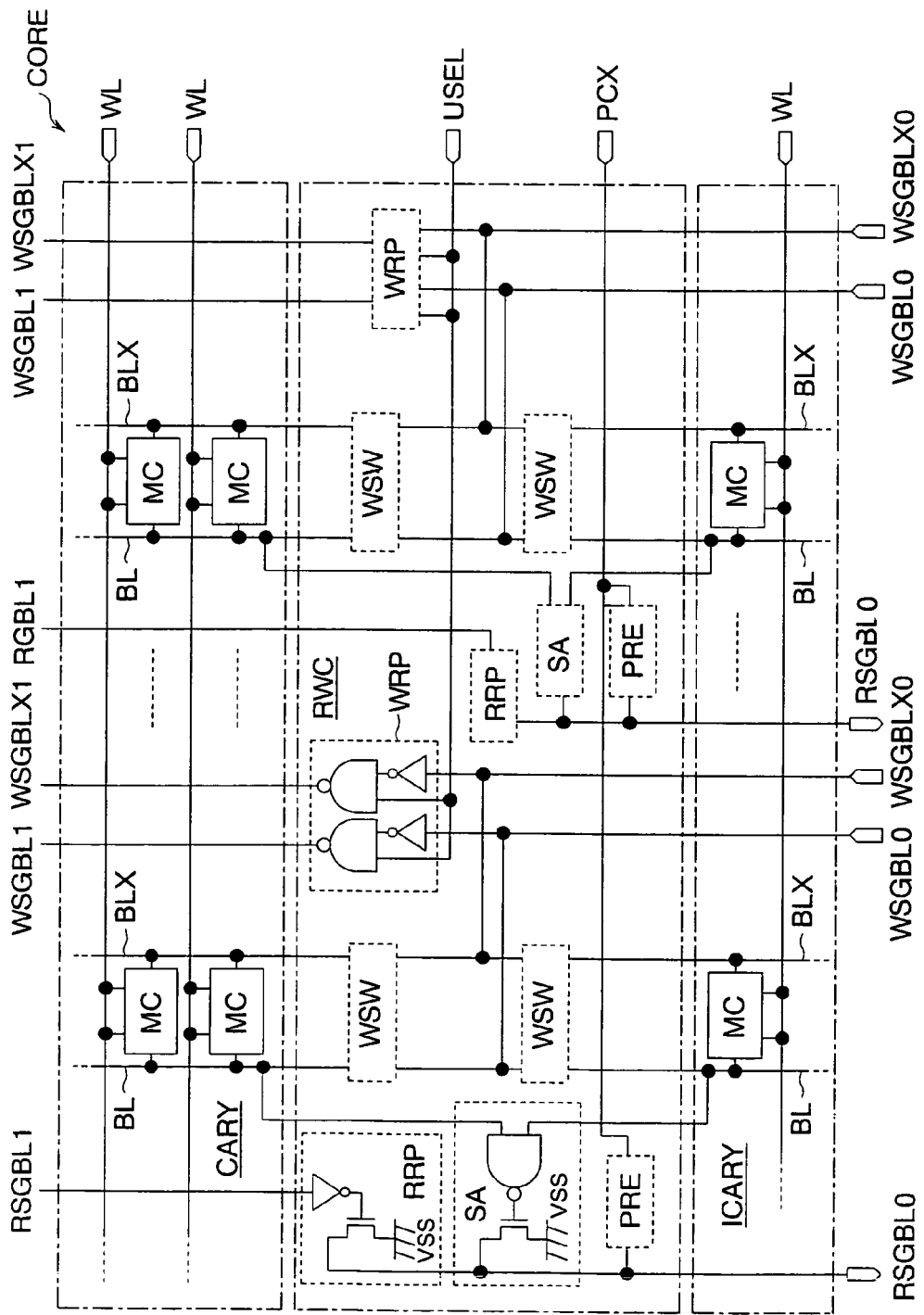
FIG. 8 is a circuit diagram showing details of a memory unit MU0 shown in FIG. 7.

FIG. 8 shows details of the memory unit MU0 shown in FIG. 7. The read/write control unit RWC of the memory unit MU0 is configured such that the repeater circuits RRP, WRP are added to the read/write control unit RWC shown in FIG. 2. In FIG. 8, write control signals WEC0-1 are not written. The read/write control unit RWC of the memory unit MU1 is the same as that shown in FIG. 2.

The repeater circuit RRP has an inverter whose input is connected to the read sub global bit line RSGBL1 and an nMOS transistor whose gate is connected to an output of the inverter. The nMOS transistor has a source connected to a ground line VSS and a drain connected to the read sub global bit line RSGBL0. When the memory unit MU0 is read-accessed, the read sub global bit line RSGBL1 keeps a high-level precharged state. The nMOS transistor of the repeater circuit RRP turns off, so that the read sub global -bit line RSGBL1 is disconnected from the read sub global bit line RSGBL0. On the other hand, when the memory unit MU1 is read-accessed, the nMOS transistor of the repeater circuit RRP turns on in response to a change of the read sub global bit line RSGBL1 to low level. Therefore, logic level of the read sub global bit line RSGBL1 is transmitted to the read sub global bit line RSGBL0.

The repeater circuit WRP has: a pair of inverters whose inputs are connected to the read sub global bit lines WSGBL0, WSGLBX0 respectively; and a pair of two-input NAND gates each receiving an output of the corresponding inverter and a unit selection signal USEL. The unit selection signal USEL is generated by a decoding unit DEC shown in FIG. 7. The decoding unit DEC changes the unit selection signal USEL to high level when the memory unit MU1 is write-accessed according to an address signal AD. At this time, the NAND gates of the repeater circuit WRP become effective, so that logic levels of the write sub global bit lines WSGBL0, WSGLBX0 are transmitted to the write sub global bit lines WSGBL1, WSGLBX1. When the memory unit MU0 is write-accessed, the unit selection signal USEL is kept at low level. Therefore, the NAND gates of the repeater circuit WRP output high level (VDD). That is, the write sub global bit lines WSGBL1, WSGLBX1 are kept at precharge level.

Figure 9:
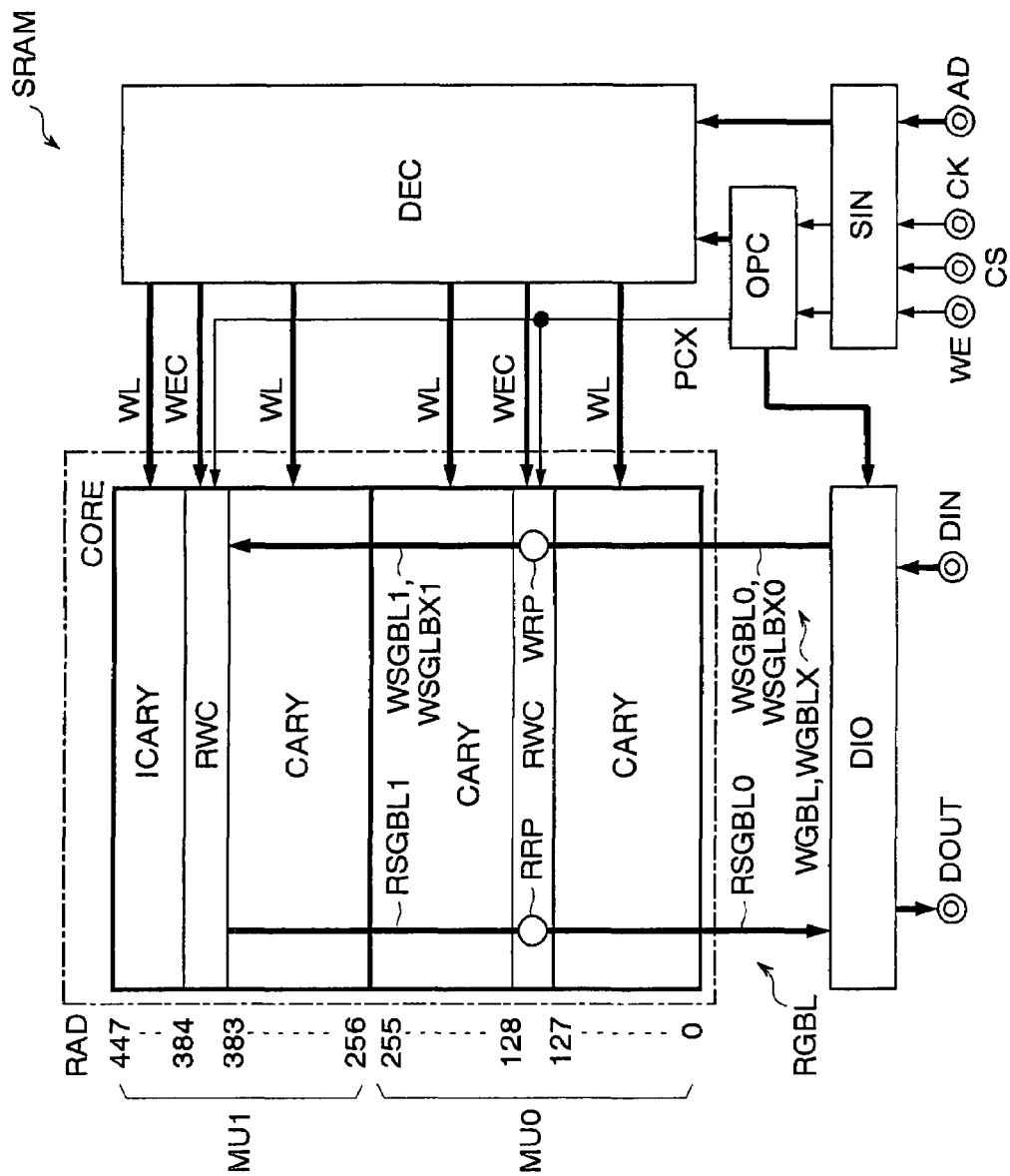
FIG. 9 is a block diagram showing a first comparative example of the third embodiment.

FIG. 9 shows a first comparative example of the third embodiment. In a case where an incomplete cell array ICARY is disposed at a position most distant from a data input/output unit DIO, sub global bit lines RSGBL1, WSGBL1, WSGBLX1 are routed on a complete cell array CARY of a memory unit MU0 and a complete cell array CARY of a memory unit MU1, as in FIG. 4 described above. Therefore, the sub global bit lines RSGBL1, WSGBL1, WSGBLX1 are longer than those in FIG. 7, so that power consumption at the access time increases.

Figure 10:
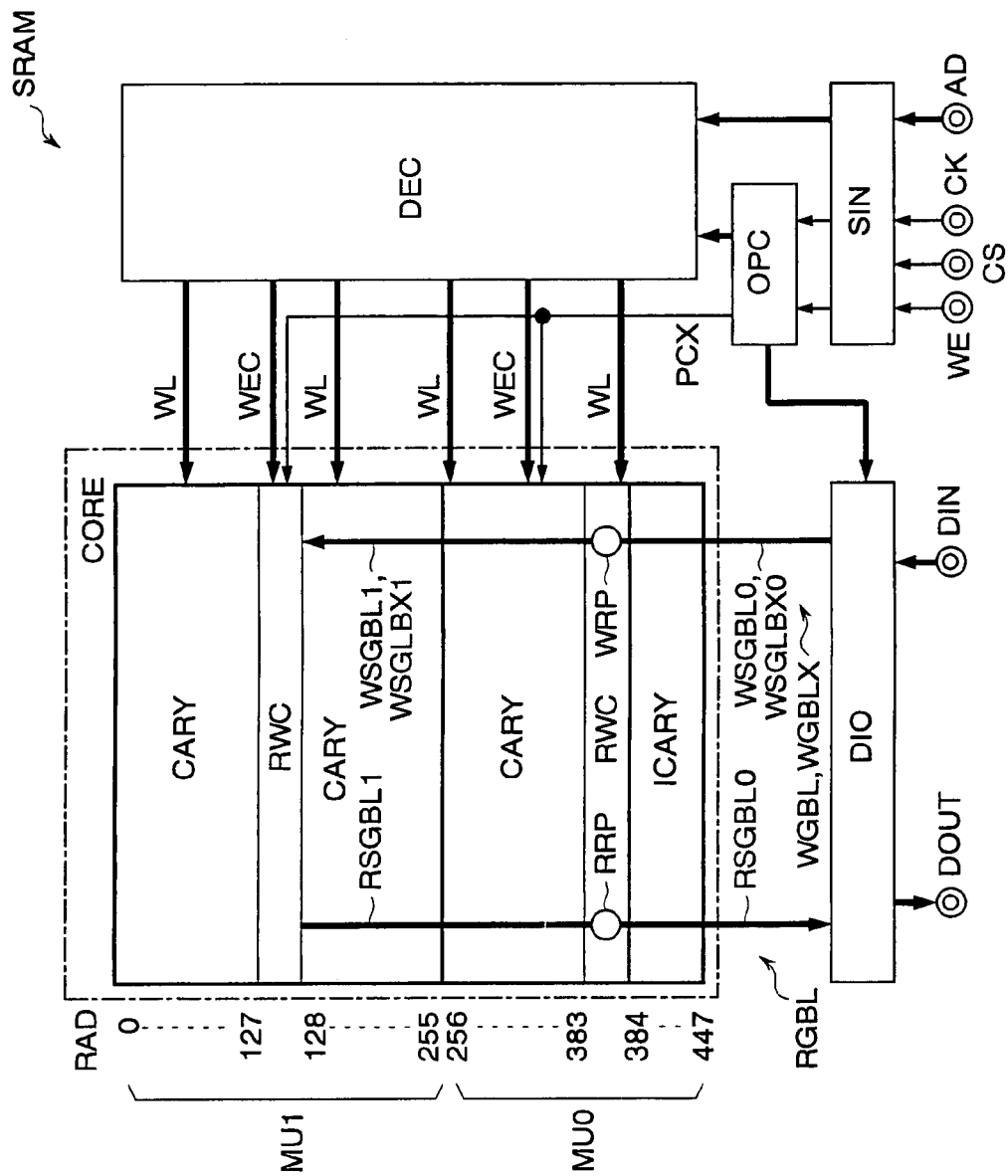
FIG. 10 is a block diagram showing a second comparative example of the third embodiment.

FIG. 10 shows a second comparative example of the third embodiment. In a case where an incomplete cell array ICARY is disposed at a position closest to a data input/output unit DIO, sub global bit lines RSGBL1, WSGBL1, WSGBLX1 are charged/discharged when a memory unit MU1 with a high access frequency is accessed. Therefore, power consumption (average value) at the access time of a SRAM increases.

The third embodiment described above can also provide the same effects as those of the above-described first embodiment. In particular, in the case where the global bit lines RGBL, WGBL, WGBLX are constituted of the sub global bit lines RSGBL0-1, WSGBL0-1, WSGLBX0-1 and the repeater circuits RRP, WRP are inserted, power consumption of the memory unit MU0 with a high access frequency can be reduced, so that average power consumption of the SRAM can be reduced and the average access time of the semiconductor memory can be shortened.

Generally, in designing a semiconductor memory having an incomplete cell array and a complete cell array, the incomplete cell array is often disposed after the complete cell array. Therefore, allocating larger addresses to the incomplete cell array than to the complete cell array makes it possible to design the cell arrays with the addresses sequentially allocated. As a result, design efficiency can be improved. In particular, a semiconductor memory having an incomplete cell array is often automatically designed by using a design tool such as a compiler. In this case, programs of the design tool can be easily designed.

Figure 11:
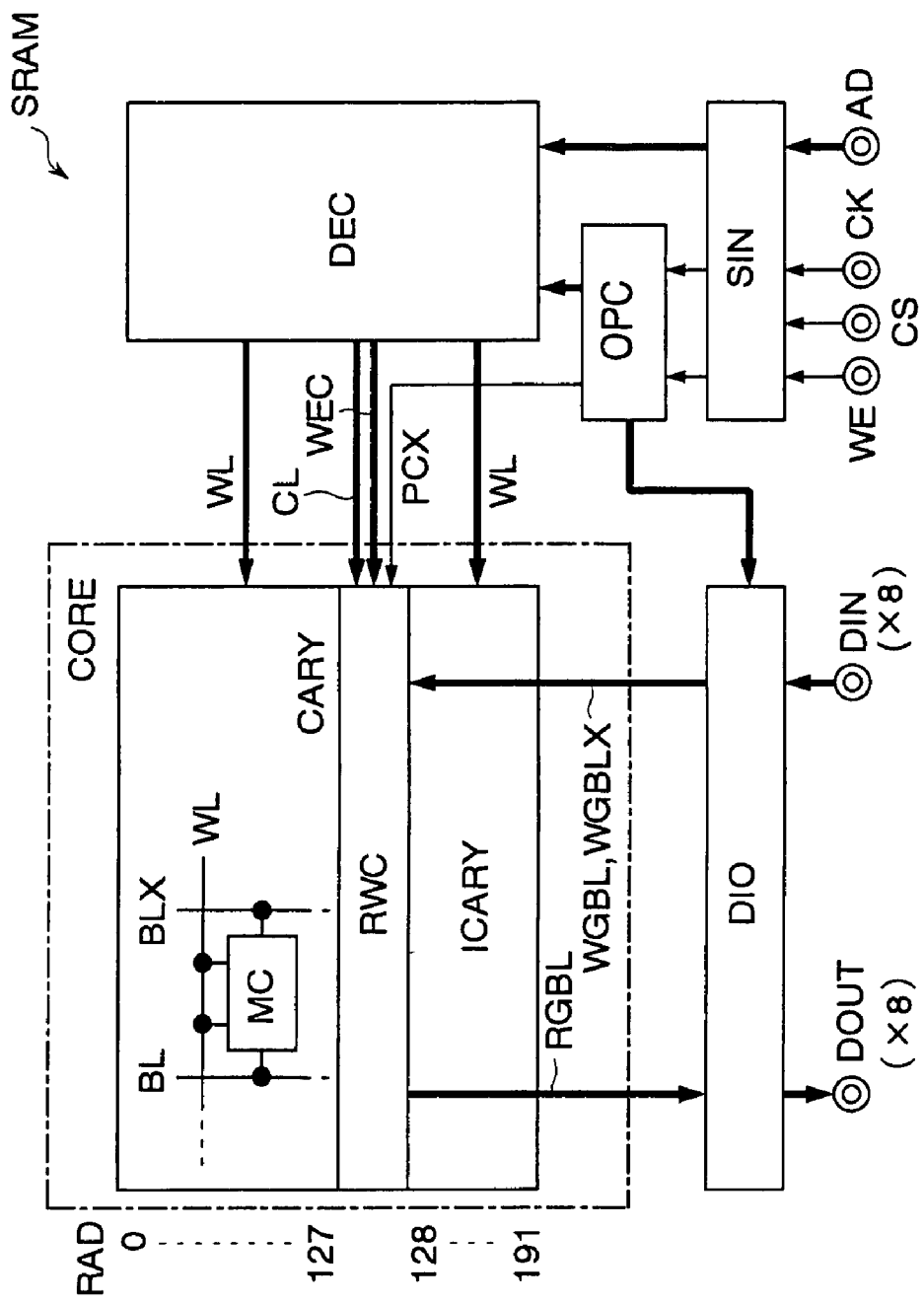
FIG. 11 is a block diagram showing a fourth embodiment of a semiconductor memory of the present invention.

FIG. 11 shows a fourth embodiment of a semiconductor memory of the present invention. The same reference symbols are used to designate the same elements as the elements described in the first embodiment, and detailed description thereof will be omitted. In a SRAM of this embodiment, each of external data terminals DOUT, DIN is constituted of 8 bits. Therefore, each of a read global bit line RGBL and write global bit lines WGBL, WGBLX is constituted of 8 lines. Further, a read/write control unit RWC is different from that of the first embodiment.

Low-order 3 bits of an address signal AD are used as a column address signal for selecting 8 bit line pairs from 64 bit line pairs BL, BLX. In a read operation, a decoding unit DEC activates one of 8 column selection signals CL (CL0-7 shown in FIG. 12) to high level according to the column address signal. In a write operation, the decoding unit DEC activates one of write control signals WEC (later-described 16 write control signals WECU, WECD) to high level according to the column address signal and a row address signal (high-order bits of the address signal). The other configuration is the same as that of the first embodiment (FIG. 1).

Figure 12:
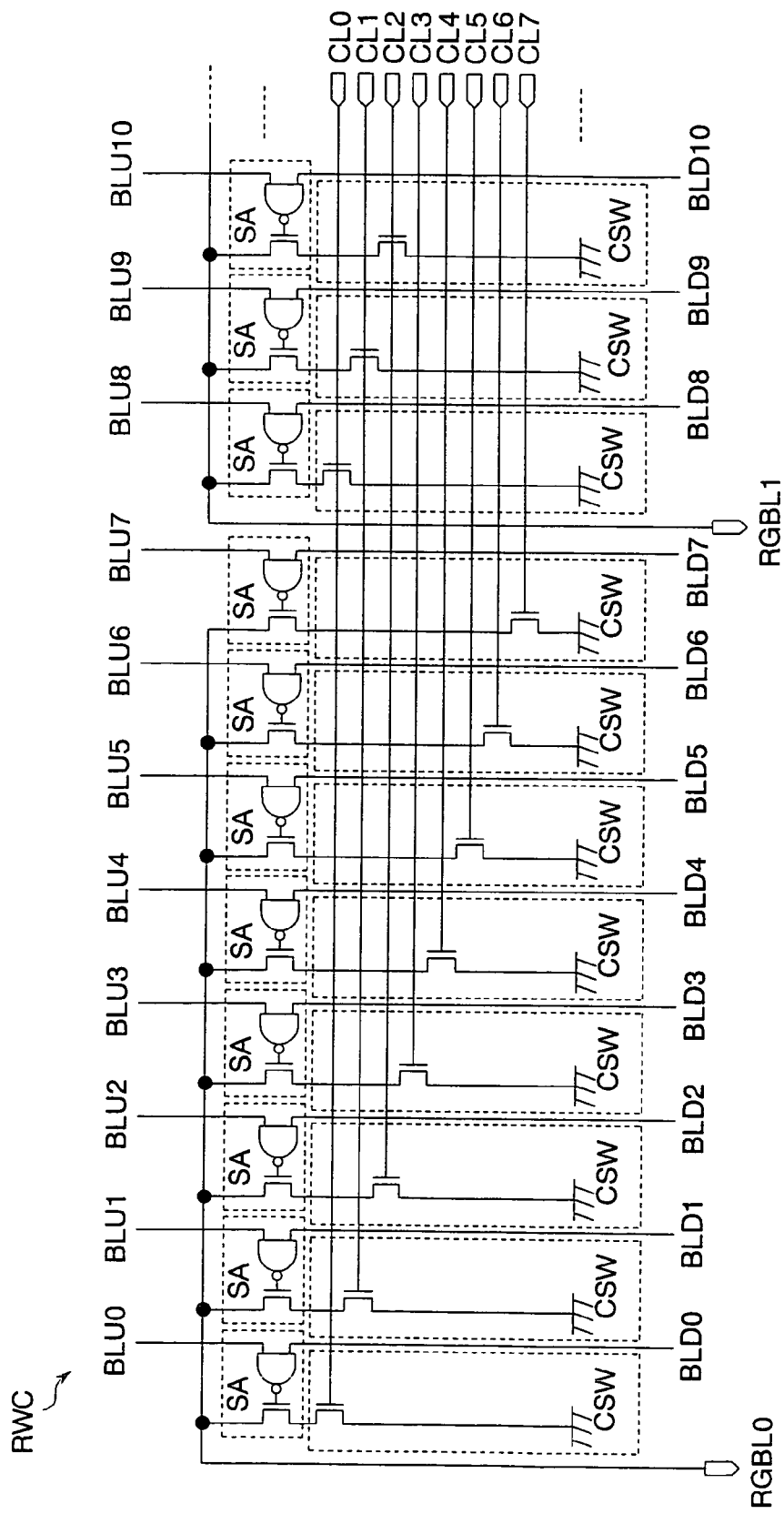
FIG. 12 is a circuit diagram showing details of a read/write control unit shown in FIG. 11.

FIG. 12 shows details of the read/write control unit RWC shown in FIG. 11. The read/write control unit RWC has column switches CSW connected to respective sense amplifiers SA. Each of the column switches CSW has an nMOS transistor connected between a ground line and a source of an nMOS transistor of the sense amplifier SA. A gate of the nMOS transistor of the column switch CSW is connected to one of column selection signal lines CL (CL0-7).

In FIG. 12, 64 bit lines BL arranged in a cell array CARY are denoted by BLU0-BLU63 (BLU0-10 are written in the drawing), and 64 bit lines BL arranged in a cell array ICARY are denoted by BLD0-BLD63 (BLD0-10 are written in the drawing). The column switches CSW corresponding to the bit lines BLU0-7, BLD0-7 operate upon receiving the column selection signals CL0-7 respectively.

Similarly, the column switches CSW corresponding to the bit lines BLU8-15, 16-23, 24-31, 32-39, 40-47, 48-55, 56-63 and the bit lines BLD8-15, 16-23, 24-31, 32-39, 40-47, 48-55, 56-63 operate upon receiving the column selection signals CL0-7 respectively. That is, in the read operation, the column switches CSW connect any 8 lines out of the bit lines BL0-63 of each of the cell arrays CARY, ICARY to global bit lines RGBL0-7 (RGBL0-1 are written in the drawing) respectively. The read global bit lines RGBL0-7 are connected to the data terminal DOUT via a data input/output unit DIO.

Incidentally, as in the first embodiment, 64 write switches WSW, though not shown, are formed for each of the cell arrays CARY, ICARY. Gates of the write switches WSW corresponding to the cell array CARY receive any of the write control signals WECU0-7. Gates of the write switches WSW corresponding to the cell array ICARY receive any of write control signals WECD0-7. In a write operation, either the write control signals WECU0-7 or the write control signals WECD0-7 are activated to high level. Then, 8 bit line pairs BL, BLX in a memory core CORE are connected to write global bit lines WGBL0-7, WGBLX0-7 respectively.

The fourth embodiment described above can also provide the same effects as those of the above-described first embodiment. In addition, also in the SRAM in which the bit lines BL, BLX connected to the read global bit line RGBL and the write global bit lines WGBL, WGBLX are selected by the column switches CSW and the write switches WSW, it is possible to reduce charge/discharge of the global bit lines RGBL, WGBL, WGBLX, so that power consumption can be reduced. Moreover, the access time of the SRAM can be shortened.

Figure 13:
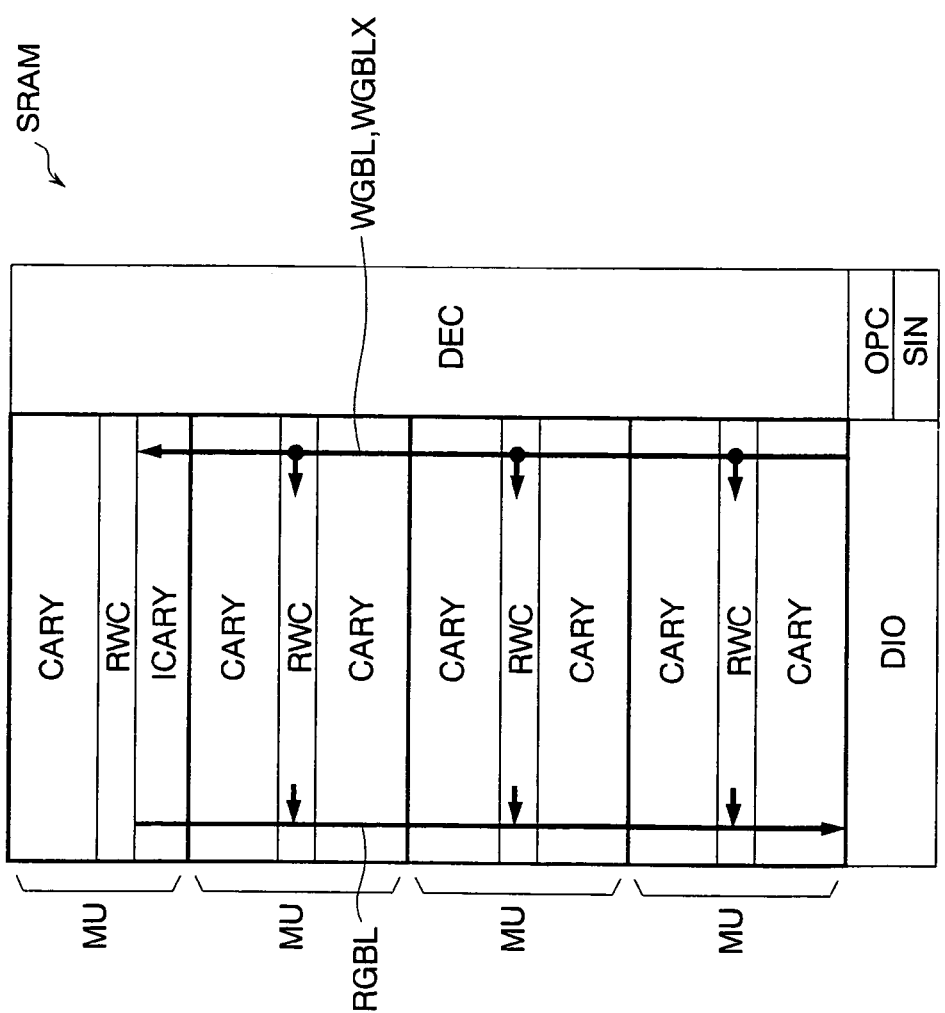
FIG. 13 is a block diagram showing an example of a semiconductor memory to which the present invention is applicable.

Incidentally, the above second and third embodiments have described the examples where the present invention is applied to the SRAM having the two memory units MU0-1. However, as shown in FIG. 13, the present invention may be applied to an SRAM having four memory units MU or more. Further, in a case where the repeater circuits RRP, WRP are not inserted, the incomplete cell array ICARY can be formed in an arbitrary memory unit MU. In this case, the incomplete cell array ICARY is disposed on a data input/output unit DIO side of the read/write control circuit RWC in the memory unit MU.

Figure 14:
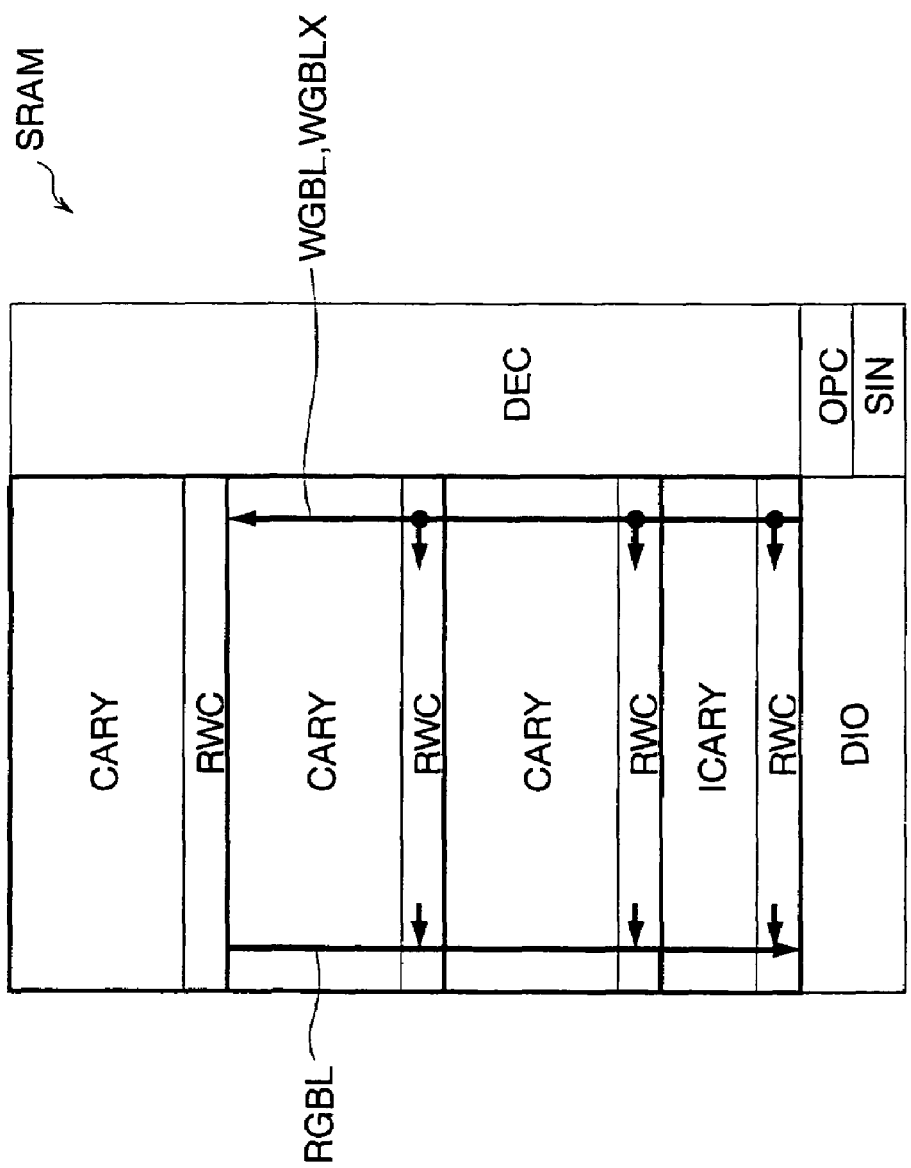
FIG. 14 is a block diagram showing another example of a semiconductor memory to which the present invention is applicable.

The above embodiments have described the examples where the present invention is applied to the SRAM in which the read/write control unit RWC is shared by the pair of cell arrays CARY (or ICARY). However, as shown in FIG. 14, the present invention may be applied to a SRAM in which the read/write control unit RWC is formed for each of the cell arrays CARY (or ICARY).

The above embodiments have described the examples where the charge/discharge current of the global bit lines RGBL, WGBL, WGBLX is reduced by applying the present invention. However, it is also possible to reduce the power consumption of the SRAM by reducing charge/discharge current of other signal lines. For example, in a SRAM having partial write specification that can instruct data read and write for each bit of a data terminal, a signal line for a sense amplifier mask signal for inactivating a sense amplifier corresponding to a bit to which the data is written is arranged in parallel to the bit lines BL, BLX. In this case, it is possible to reduce charge/discharge current of the signal line through which the sense amplifier mask signal is transmitted. Generally, the application of the present invention makes it possible to reduce the charge/discharge current of a signal line extending up to the read/write control unit RWC in parallel to the bit lines BL, BLX, so that power consumption while a semiconductor memory is in operation can be reduced.

The above embodiments have described the examples where the present invention is applied to the SRAM. However, the present invention is also applicable to other semiconductor memories such as a DRAM and a pseudo SRAM.

The invention is not limited to the above embodiments and various modifications may be made without departing from the spirit and scope of the invention. Any improvement may be made in part or all of the components.

What is claimed is:

1. A semiconductor memory comprising:
a plurality of cell arrays arranged in one direction and each having memory cells and, bit lines and word lines connected to the memory cells;
a read/write control unit disposed between a pair of the cell arrays and shared by the pair of the cell arrays to control data reading and writing;
a plurality of memory units each including the pair of the cell arrays and said read/write control unit;
a global line extending from one end of a row of said cell arrays toward a direction where said cell arrays are arranged, and connected to said read/write control unit to be commonly used for said cell arrays; and
a signal control unit disposed on one-end side of the row of said cell arrays and receiving/outputting a signal from/to said global line, wherein:
said cell arrays are composed of at least one complete cell array having a predetermined memory capacity and an incomplete cell array having a capacity smaller than said predetermined memory capacity and being shorter in length in the direction of the cell array arrangement than said complete cell array; and
said incomplete cell array is disposed closer to said signal control unit than said complete cell array, and
said incomplete cell array is included in one of said memory units, and is disposed on the signal control unit side of the corresponding read/write control unit.

2. The semiconductor memory according to claim 1, wherein:
said signal control unit is a data input/output unit receiving/outputting data from/to said cell arrays; and
said global line is a global bit line through which the data are transmitted between said cell arrays and said data input/output unit.

3. The semiconductor memory according to claim 1, wherein:
addresses allocated to said word lines are in an ascending order from a distant side from said signal control unit to a less distant side therefrom; and
said incomplete cell array includes the word line to which a largest address is allocated.

4. The semiconductor memory according to claim 1, wherein:
the memory unit including said incomplete cell array is disposed at a position closest to said signal control unit;
in said cell arrays, addresses allocated to said word lines are in an ascending order from a distant side from said signal control unit to a less distant side therefrom; and
said incomplete cell array includes the word line to which a largest address is allocated.

5. The semiconductor memory according to claim 1, further comprising:
a plurality of sub global lines constituting said global line; and
a repeater circuit formed in an area in which the read/write control unit of said memory unit close to said signal control unit is disposed, in order to connect a sub global line distant from said signal control unit to a sub global line close to said signal control unit, wherein
the memory unit including said incomplete cell array is disposed at a position most distant from said signal control unit.

6. The semiconductor memory according to claim 5, wherein:
said signal control unit is a data input/output unit receiving/outputting data from/to said cell arrays; and
said global line is a global bit line through which the data are transmitted between said cell arrays and said data input/output unit.

7. The semiconductor memory according to claim 5, wherein:
in the memory unit not including said incomplete cell array, addresses allocated to said word lines are in an ascending order from a less distant side from said signal control unit to a distant side therefrom;
in the memory unit including said incomplete array, addresses allocated to said word lines are in an ascending order from a distant side from said signal control unit to a less distant side therefrom; and
said incomplete cell array includes the word line to which a largest address is allocated.

8. The semiconductor memory according to claim 1, wherein the semiconductor memory is formed as a RAM macro whose circuit information is generated by a compiler and whose memory capacity is settable according to user specification.

9. A semiconductor memory comprising:

a plurality of cell arrays arranged in one direction and each having memory cells and, bit lines and word lines connected to the memory cells;

a read/write control unit disposed between said cell arrays to control data read/write from/to said cell arrays;

a global line extending from one end of a row of said cell arrays toward a direction where said cell arrays are arranged, and connected to said read/write control unit to be commonly used for said cell arrays; and a signal control unit disposed on one-end side of the row of said cell arrays and receiving/outputting a signal from/to said global line, wherein:

said cell arrays are composed of at least one complete cell array having a predetermined memory capacity and an incomplete cell array having a capacity smaller than said predetermined memory capacity and being shorter in length in the direction of the cell array arrangement than said complete cell array;

said incomplete cell array is disposed closer to said signal control unit than said complete cell array;

addresses allocated to said word lines are in an ascending order from a distant side from said signal control unit to a less distant side therefrom; and said incomplete cell array includes the word line to which a largest address is allocated.

* * * * *